(12) United States Patent
Hidaka et al.

(10) Patent No.: US 7,339,218 B2
(45) Date of Patent: Mar. 4, 2008

(54) SEMICONDUCTOR MEMORY DEVICE AND METHOD OF MANUFACTURING THE SAME

(75) Inventors: Osamu Hidaka, Hachioji (JP); Iwao Kunishima, Yokohama (JP); Hiroyuki Kanaya, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 89 days.

(21) Appl. No.: 10/885,749

(22) Filed: Jul. 8, 2004

(65) Prior Publication Data

US 2005/0118795 A1 Jun. 2, 2005

(30) Foreign Application Priority Data

Nov. 27, 2003 (JP) ............................. 2003-398162

(51) Int. Cl.
*H01L 29/76* (2006.01)
*H01L 29/94* (2006.01)
*H01L 31/062* (2006.01)

(52) U.S. Cl. ............ 257/295; 257/E29.76; 257/E29.94; 257/E31.062

(58) Field of Classification Search ........ 257/295–296, 257/303, 306, 311
See application file for complete search history.

(56) References Cited

U.S. PATENT DOCUMENTS 6,611,015 B2 8/2003 Ozaki et al.

6,972,449 B2 * 12/2005 Yoshikawa et al. ......... 257/295

FOREIGN PATENT DOCUMENTS

JP 2004-349424 12/2004

* cited by examiner

*Primary Examiner*—Theresa T. Doan
(74) *Attorney, Agent, or Firm*—Oblon, Spivak, McClelland, Maier & Neustadt, P.C.

(57) ABSTRACT

A semiconductor memory device includes a semiconductor substrate having a first region and a second region, a transistor placed in the first region of the semiconductor substrate, a first insulating film formed on the semiconductor substrate in the first and second regions and on the transistor, a first ferroelectric capacitor formed on the first insulating film in the first region and electrically connected to the transistor, a hydrogen barrier film formed above the first ferroelectric capacitor and above the first insulating film in the first and second regions, a first contact penetrating the hydrogen barrier film in the first region and electrically connected to the first ferroelectric capacitor, and a second contact which penetrates the hydrogen barrier film in the second region and which is in a floating state.

7 Claims, 15 Drawing Sheets

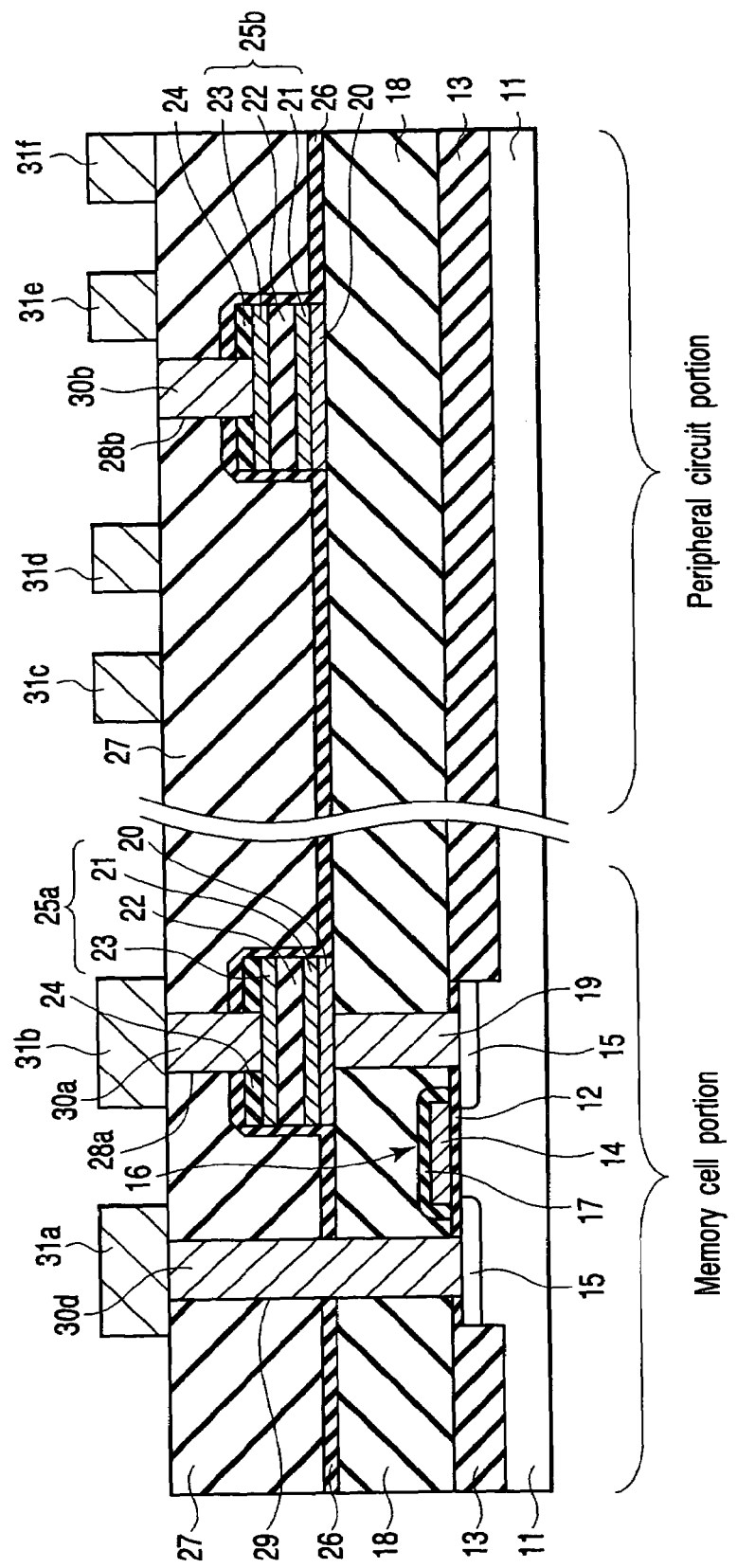
F I G. 2

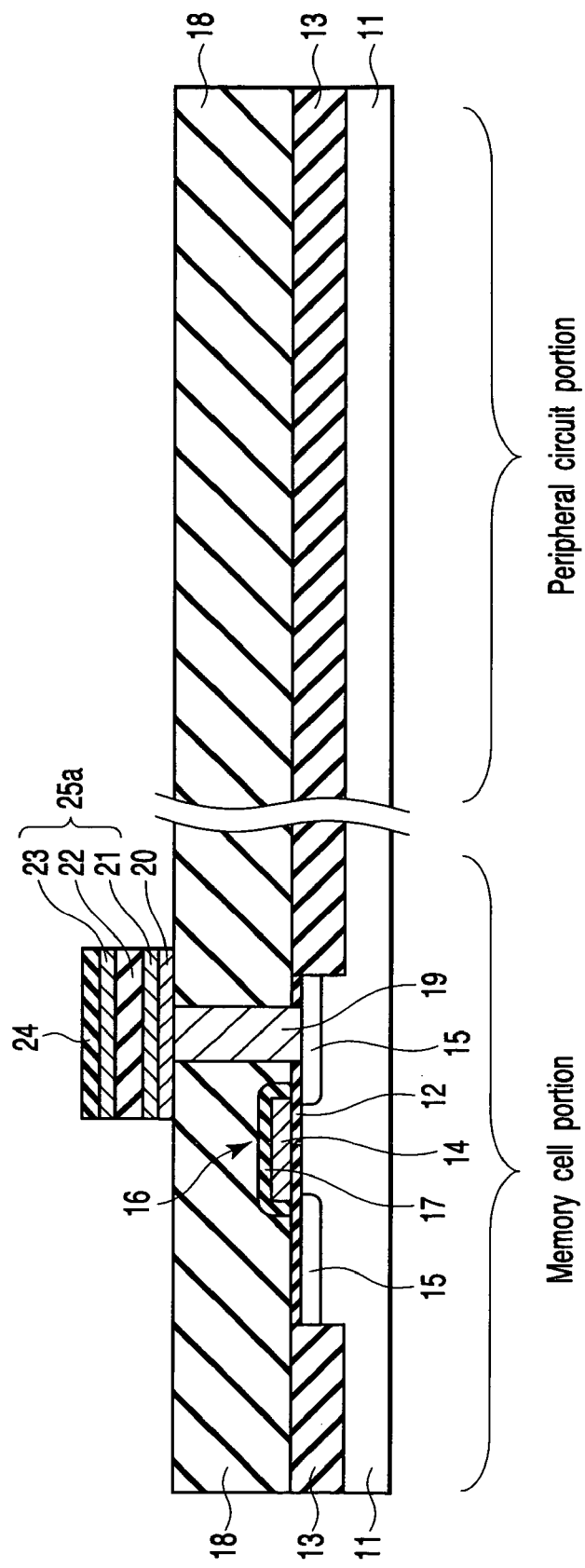
F I G. 11

SEMICONDUCTOR MEMORY DEVICE AND METHOD OF MANUFACTURING THE SAME

CROSS-REFERENCE TO RELATED APPLICATIONS

This application is based upon and claims the benefit of priority from prior Japanese Patent Application No. 2003-398162, filed Nov. 27, 2003, the entire contents of which are incorporated herein by reference.

BACKGROUND OF THE INVENTION

1. Field of the Invention

The present invention relates to a semiconductor memory device comprising a ferroelectric capacitor and a method of manufacturing this semiconductor memory device.

2. Description of the Related Art

Nonvolatile memories (hereinafter referred to as FeRAMs: Ferroelectric Random Access Memories) having a capacitor portion composed of a ferroelectric substance can be used for high speed operations without any batteries. Accordingly, the FeRAM is now often mounted in a non-contact card such as an RF-ID by being mixed with a logic circuit or the like. The FeRAM is also expected to be a memory that replaces conventional SRAMs (Static Random Access Memories), flash memories, and DRAMs (Dynamic Random Access Memories).

The conventional FeRAM is formed using, for example, the process described below. First, a transistor is formed on a silicon substrate. Then, a first interlayer insulating film is deposited on the transistor. The first interlayer insulating film is then flattened. Then, a ferroelectric capacitor is formed on the first interlayer insulating film. Subsequently, annealing is carried out to recover the ferroelectric capacitor from possible damage. Then, a hydrogen barrier film is deposited on the ferroelectric capacitor. Then, a second interlayer insulating film is deposited on the hydrogen barrier film. The second interlayer insulating film is then flattened. Then, contact holes are formed through the second interlayer insulating film and the hydrogen barrier film. Subsequently, annealing is carried out to recover the ferroelectric capacitor from possible damage. Then, a metal material is filled into the contact holes to form contacts. Subsequently, interlayer insulating films or multilayer interconnects are formed as required.

Such a conventional FeRAM has the problems described below. The ferroelectric characteristic of the ferroelectric capacitor is known to be degraded in a hydrogen atmosphere. Thus, to prevent the capacitor from being degraded in the hydrogen atmosphere during an interconnection step after the capacitor has been formed, a hydrogen barrier film is normally formed on the capacitor. However, the hydrogen barrier film inhibits hydrogen from diffusing from a surface of a wafer to the interior of the capacitor. Consequently, the hydrogen barrier film may inhibit the diffusion of water molecules, which have a larger molecular weight than hydrogen. That is, the hydrogen barrier film may produce a secondary effect of suppressing the release of gases from under the hydrogen barrier film. As a result, when annealing is carried out to recover the capacitor from possible damage done to the capacitor during processing, volatile components such as moistures and gases may be generated from the interlayer insulating film. The volatile components are deposited immediately below the hydrogen barrier film at a high concentration owing to the secondary effect.

Under these circumstances, when contact holes are formed through the hydrogen barrier film, the volatile components accumulated through the contact holes are explosively diffused. The explosive release of gases may cause voids to be formed in the contact holes when a metal material is filled into the contact holes to form contacts. Disadvantageously, this may prevent the contacts from being appropriately filled, thus, for example, degrading the reliability of interconnects.

BRIEF SUMMARY OF THE INVENTION

According to a first aspect of the present invention, there is provided a semiconductor memory device comprising a semiconductor substrate having a first region and a second region, a transistor placed in the first region of the semiconductor substrate, a first insulating film formed on the semiconductor substrate in the first and second regions and on the transistor, a first ferroelectric capacitor formed on the first insulating film in the first region and electrically connected to the transistor, a hydrogen barrier film formed above the first ferroelectric capacitor and above the first insulating film in the first and second regions, a first contact penetrating the hydrogen barrier film in the first region and electrically connected to the first ferroelectric capacitor, and a second contact which penetrates the hydrogen barrier film in the second region and which is in a floating state.

According to a second aspect of the present invention, there is provided a method of manufacturing a semiconductor memory device, the method comprising forming a transistor in a first region of a semiconductor substrate having the first region and a second region, forming a first insulating film in the first and second regions of the semiconductor substrate and on the transistor, forming a first ferroelectric capacitor on the first insulating film in the first region, the first ferroelectric capacitor being electrically connected to the transistor, forming a hydrogen barrier film above the first ferroelectric capacitor and above the first insulating film in the first and second regions, forming a second insulating film on the hydrogen barrier film, forming a first contact hole penetrating the hydrogen barrier film in the first region to expose a top surface of the first ferroelectric capacitor and forming a second contact hole penetrating the hydrogen barrier film in the second region, carrying out annealing, filling a metal material into the first and second contact holes to form a first contact connected to the first ferroelectric capacitor and a second contact which is in a floating state.

BRIEF DESCRIPTION OF THE SEVERAL VIEWS OF THE DRAWING

FIG. 2 is a sectional view of a semiconductor device taken along a line II-II in FIG. 1;

FIG. 11 is a sectional view showing a step of manufacturing a semiconductor memory device according to the second embodiment of the present invention;

DETAILED DESCRIPTION OF THE INVENTION

Figure 1:
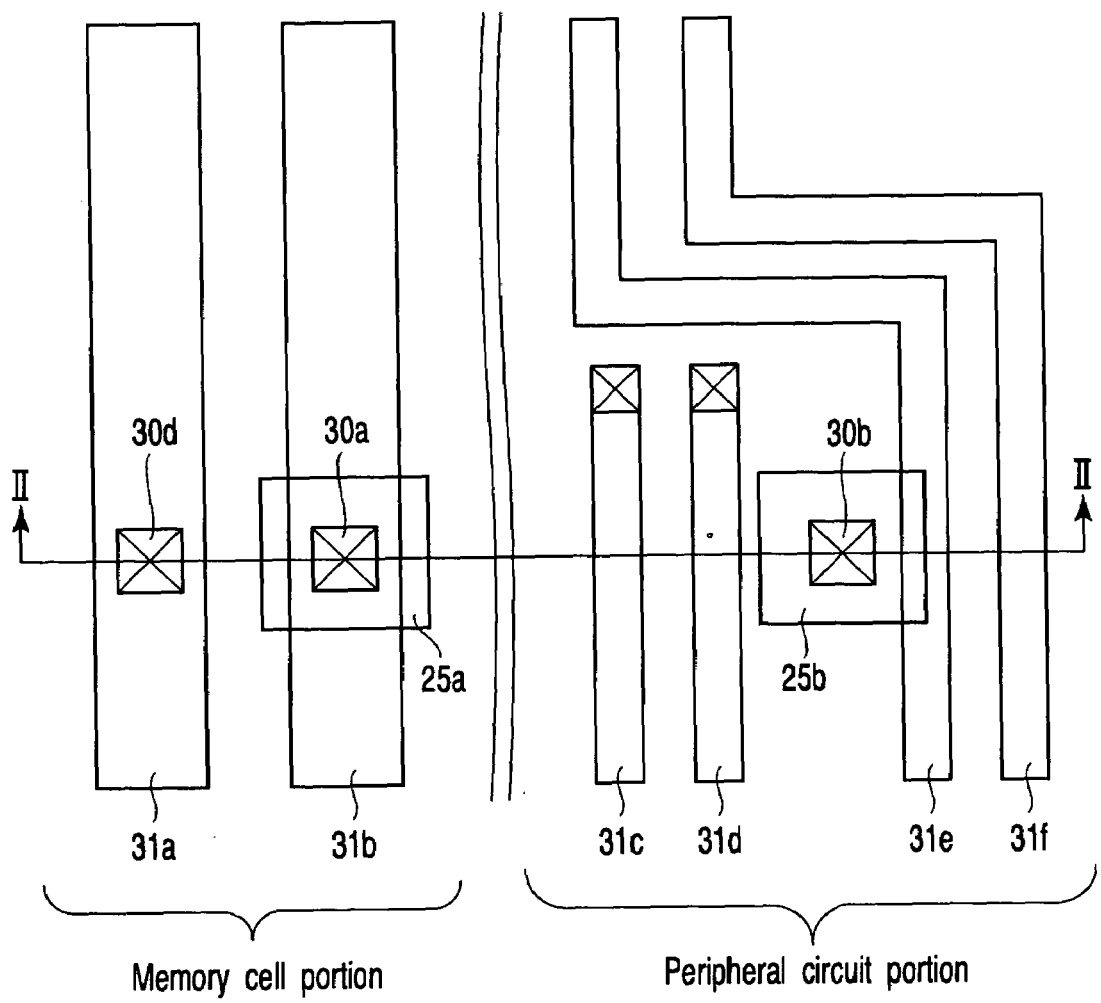
FIG. 1 is a plan view showing a semiconductor memory device according to a first embodiment of the present invention.

Embodiments of the present invention will be described below with reference to the drawings. In the description below, parts common to all the drawings are denoted by the same reference numerals.

First Embodiment

A first embodiment is an example in which the evaporation of gasses accumulated under a hydrogen barrier film is controlled by forming a dummy capacitor and a dummy capacitor contact in a peripheral circuit portion in which capacitors or the like are conventionally not present.

FIGS. 1 and 2 show a semiconductor memory device according to a first embodiment of the present invention. As shown in FIGS. 1 and 2, in a peripheral circuit portion, a dummy ferroelectric capacitor 25b having an upper electrode 23, a ferroelectric film 22, and a lower electrode 21 is formed on a first interlayer insulating film 18. A hydrogen barrier film 26 is formed on the capacitor 25b. A dummy capacitor contact 30b is provided so as to penetrate the hydrogen barrier film 26 to connect to the capacitor 25b. At least one end of a dummy element composed of the capacitor 25b and the contact 30b is not electrically connected to other interconnects or elements and is in a floating state. Consequently, no current flows through the capacitor 25b or the contact 30b. Further, the capacitor 25b and contact 30b in the peripheral circuit portion are arranged at the same levels as those at which a capacitor 25a and a contact 30a in a memory cell portion are arranged. The capacitor 25b and the contact 30b are also formed simultaneously with the capacitor 25a and contact 30a so as to have the same shapes as those of them, using the same materials as those of them.

Interconnects 31c, 31d, 31e, and 31f arranged on a second interlayer insulating film 27 and the contact 30b need not be connected together provided that they are in the floating state.

In the memory cell portion, a transistor 16 is formed by forming a gate electrode 14 on a silicon substrate 11 via a gate insulating film 12 and forming a source/drain diffusion layer 15 in the silicon substrate 11 at opposite sides of the gate electrode 14. The first interlayer insulating film 18 is formed so as to cover the transistor 16. A contact 19 is formed in the first interlayer insulating film 18 so as to connect to the source/drain diffusion layer 15. The ferroelectric capacitor 25a having the upper electrode 23, ferroelectric film 22, and lower electrode 21 is formed on the contact 19. The hydrogen barrier film 26 is formed so as to cover the capacitor 25a and the first interlayer insulating film 18. The second interlayer insulating film 27 is formed on the hydrogen barrier film. Interconnects 31a and 31b are formed on the second interlayer insulating film 27. The interconnect 31a is connected to the source/drain diffusion layer 15 via a contact 30d penetrating the interlayer insulating films 18 and 27 and the hydrogen barrier film 26. The interconnect 31b is connected to the upper electrode 23 of the capacitor 25a via the contact 30a, penetrating the interlayer insulating film 27 and the hydrogen barrier film 26.

In the memory cell portion and the peripheral circuit portion, an oxygen barrier film 20 is provided under each of the capacitors 25a and 25b. A hard mask layer 24 is provided on each of the capacitors 25a and 25b. The oxygen barrier film 20 in the memory cell portion can prevent the contact 19 from being oxidized during annealing, which is required to crystallize a ferroelectric substance or during annealing required to recover the processed ferroelectric film 22 from possible damage. The hard mask layer 24 is used as a mask in processing the capacitors 25a and 25b. For example, the hard mask layer 24 composed of a PECVD (Plasma Enhanced Chemical Vapor Deposition)-$SiO_2$ film is left after the capacitors 25a and 25b have been formed.

FIGS. 3 to 6 are sectional views showing steps of manufacturing a semiconductor memory device according to a first embodiment of the present invention. Description will be given of the method of manufacturing a semiconductor memory device according to the first embodiment.

Figure 3:
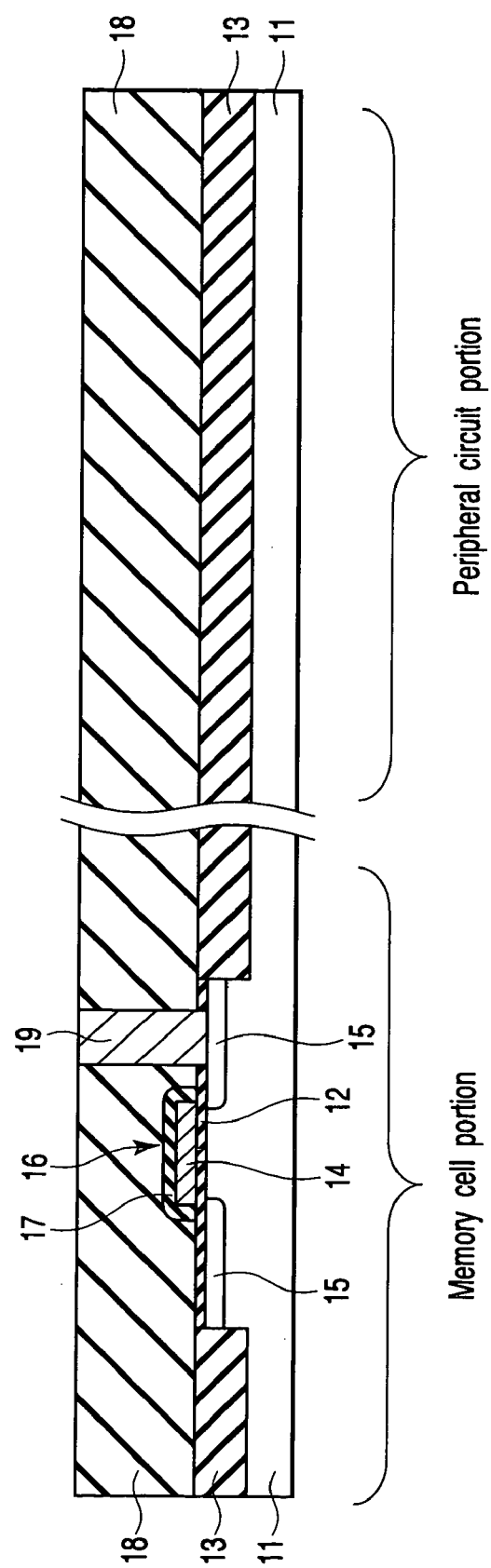
FIG. 3 is a sectional view showing a step of manufacturing a semiconductor memory device according to the first embodiment of the present invention.

First, as shown in FIG. 3, the gate insulating film 12 composed of, for example, an SiN film is formed on the silicon film 11. An element isolation region 13 having an STI (Shallow Trench Isolation) structure is formed in the silicon substrate 11. Then, the gate electrode 14 is formed on the silicon substrate 11 in the memory cell portion via the gate insulating film 12. The source/drain diffusion layer 15 is then formed in the silicon substrate 11 at the opposite sides of the gate electrode 14. In this manner, the transistor 16, for example, a CMOS, is formed. Then, the insulating film 17 is formed on a top and bottom surfaces of the gate electrode 14. Then, the first interlayer insulating film 18 composed of, for example, a BPSG (Boron Phosphorous Silicate Glass) film is deposited on the transistor 16 and the silicon substrate 11. The first interlayer insulating film 18 is then flattened using CMP (Chemical Mechanical Polish). Subsequently, the contact 19 is formed in the first interlayer insulating film 18 in order to electrically connect the capacitor and the transistor 16 together. A desirable material filled into the contact 19 is tungsten, which serves to reduce resistance, but may be polysilicon.

Figure 4:
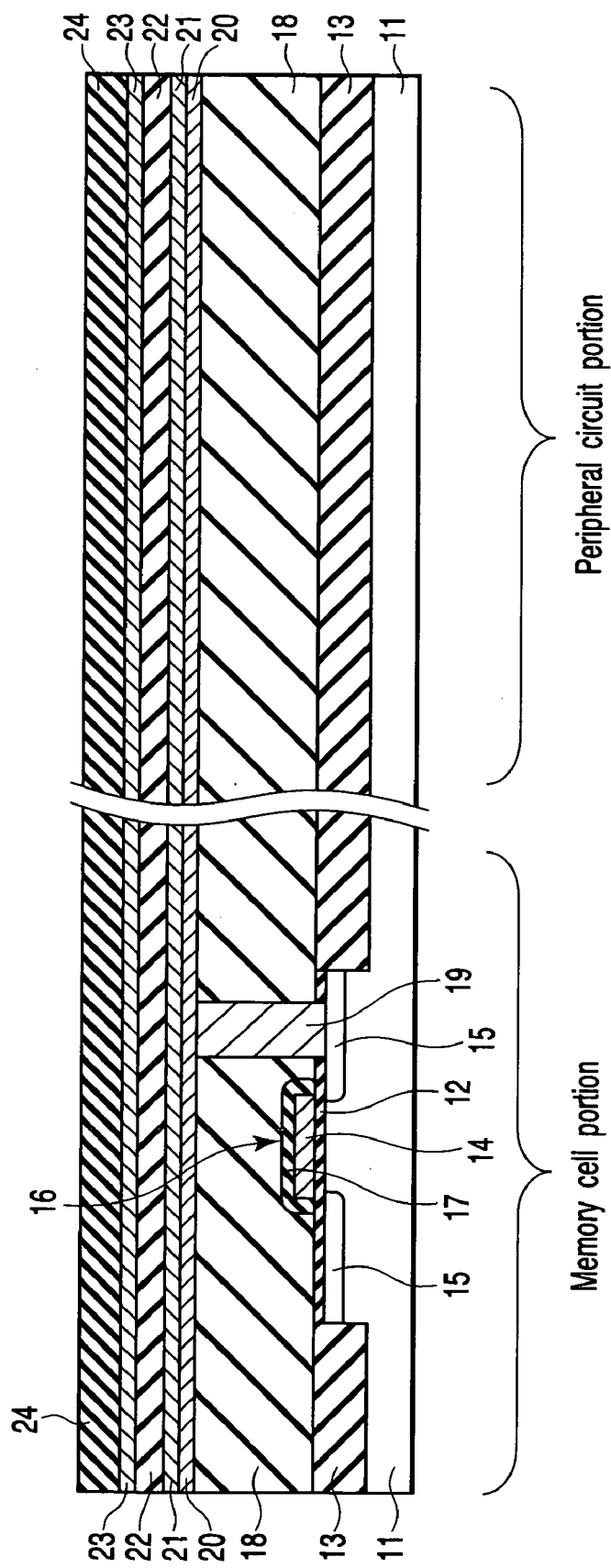
FIG. 4 is a sectional view showing a continued part of FIG. 3 and showing a step of manufacturing a semiconductor memory device according to the first embodiment of the present invention.

Then, as shown in FIG. 4, the oxygen barrier film 20, the lower electrode 21, the ferroelectric film 22, and the upper electrode 23 are sequentially deposited on the first interlayer insulating film 18 and the contact 19.

An effective material for the lower electrode 21 is, for example, platinum, iridium, iridium oxide, strontium ruthenium oxide ($SrRuO_3$; hereinafter referred to as SRO), or their combination. The oxygen barrier film 20 may be formed of a titanium-based material or a titanium/aluminum-based material. The structure of a stacked film composed of the oxygen barrier film 20 and lower electrode 21 is, for example, a combination of Pt/Ti/TiN, SRO/Pt/Ti/TiN, $IrO_2$/Ir/Ti/TiN, or $IrO_2$/Ir/TiAlN/TiN. If the stacked film composed of the oxygen barrier film 20 and the lower electrode 21 is $IrO_2$/Ir/TiAlN/TiN, the materials may be deposited so that the layers have a thickness of, for example, 30, 30, 30, and 50 nm, respectively.

A useful material for the ferroelectric film 22 is PZT because it has a large remanence polarization. However, strontium bismuth titanate oxide (bismuth-based laminar perovskite; hereinafter referred to as SBT) or the like may be employed in place of PZT. The ferroelectric film 22 is deposited to a thickness of about 150 nm using a sputtering process. However, instead of the sputtering process, a sol-gel process or a MOCVD (Metal Organic Chemical Vapor Deposition) process may be used to form the film. The ferroelectric film 22 is crystallized by, for example, being annealed in a pure oxygen atmosphere at 600° C. for one hour.

If the upper electrode 23 is composed only of Pt, it is easily fatigued when subjected to repeated writes and reads. Accordingly, a desirable material is, for example, a stacked film of Ir/$IrO_2$, a stacked film of Pt/SRO, or a stacked film of Ir/SRO, a single film of $IrO_2$, or a stacked film of $IrO_2$/SRO. If the upper electrode 23 is a stacked film of Ir/$IrO_2$, the materials may be deposited so that the layers have a thickness of, for example, 10 and 20 nm.

Then, the hard mask layer 24 is deposited on the upper electrode 23 to a thickness of about 500 nm. A desirable material for the hard mask layer 24 is, for example, a PECVD-$SiO_2$ film, $Al_2O_3$ film, TiAlN film, a PECVD-$SiO_2$/$Al_2O_3$ film, a PECVD-$SiO_2$/TiAlN film.

Figure 5:
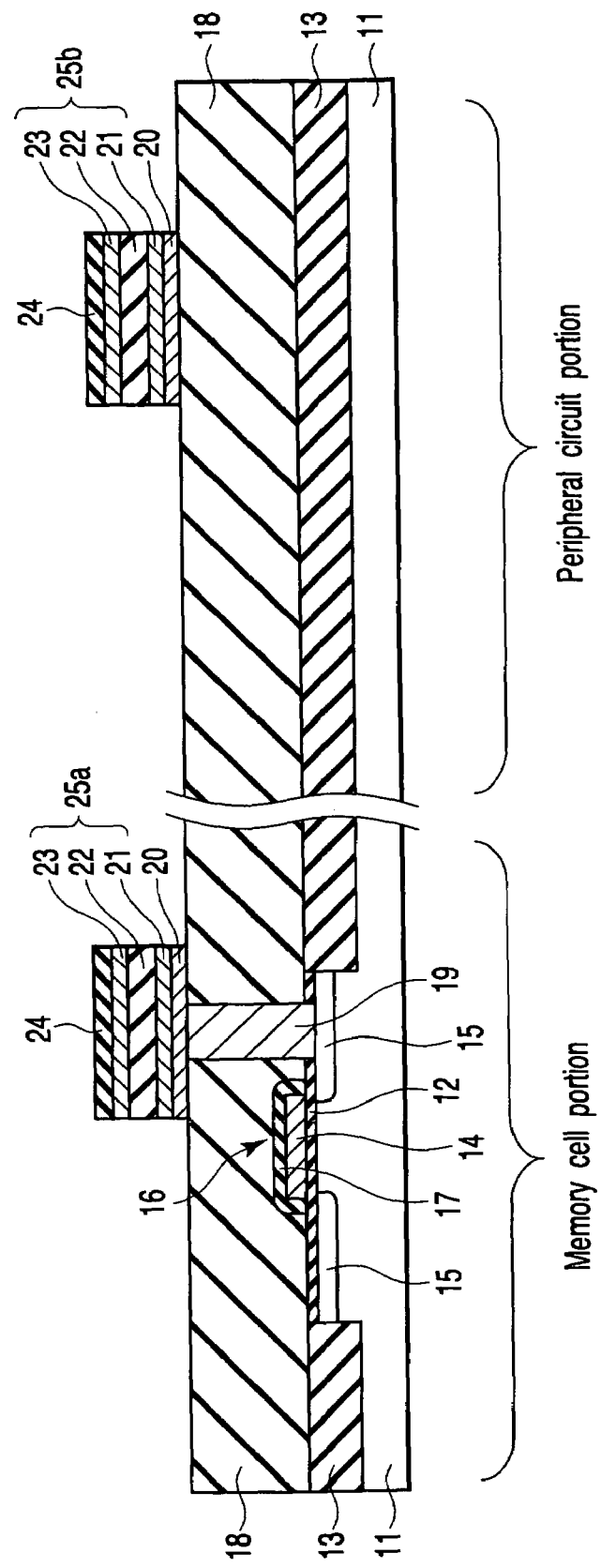
FIG. 5 is a sectional view showing a continued part of FIG. 4 and showing a step of manufacturing a semiconductor memory device according to the first embodiment of the present invention.

Then, as shown in FIG. 5, a resist (not shown) is formed on the hard mask layer 24 and then patterned. The patterned resist is then used as a mask to remove the hard mask layer 24 by anisotropic etching such as RIE (Reactive Ion Etching). Then, the patterned hard mask layer 24 is used to remove the upper electrode 23, the ferroelectric film 22, the lower electrode 21, and the barrier film 20 by anisotropic etching such as RIE. In this case, the upper electrode 23, the ferroelectric film 22, the lower electrode 21, and the barrier film 20 are desirably etched at a time by changing etching conditions for the respective materials of the films. In this manner, the ferroelectric capacitor 25a is formed in the memory cell portion. The dummy ferroelectric capacitor 25b is formed in the peripheral circuit portion. Then, a normal ashing process is used to remove the resist. Subsequently, annealing is executed at 600° C. for one hour in order to eliminate possible damage done to the capacitor 25a during the capacitor processing.

Figure 6:
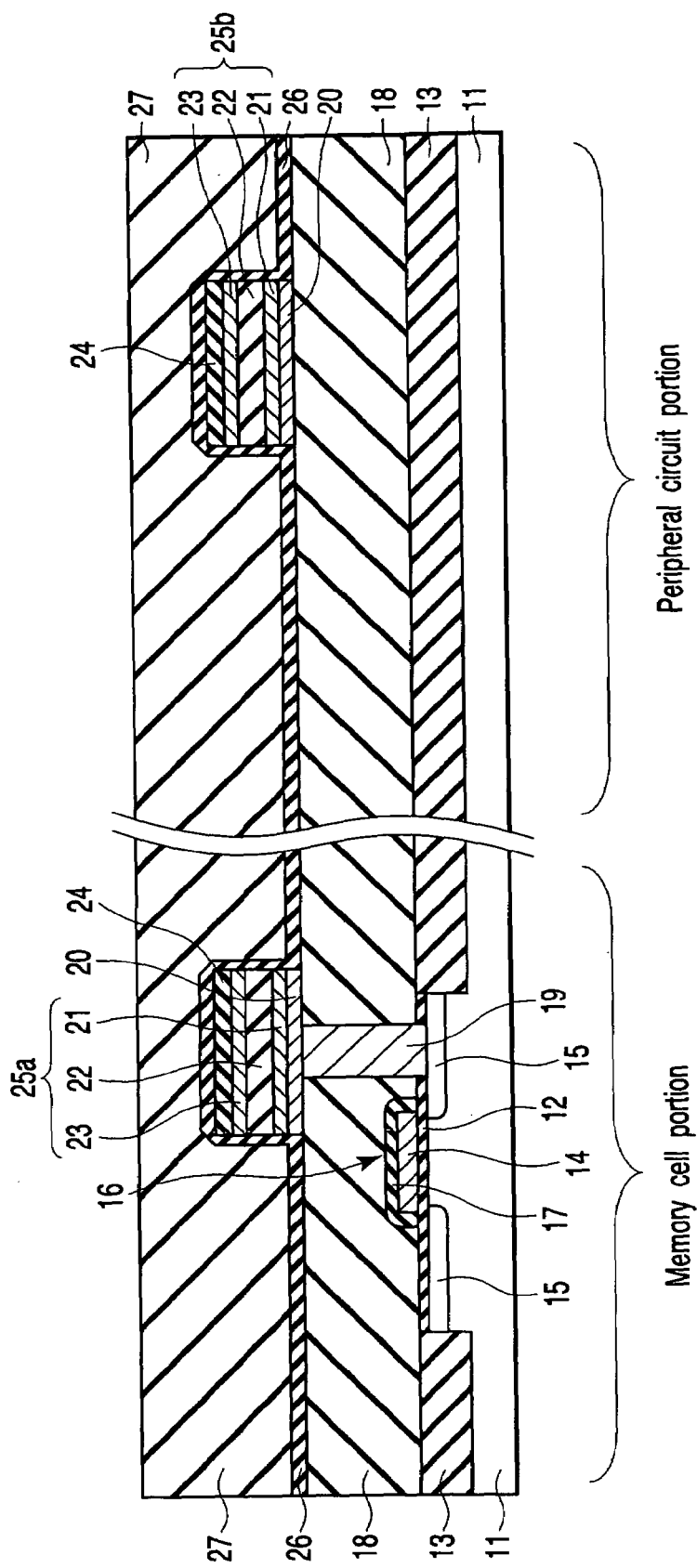
FIG. 6 is a sectional view showing a continued part of FIG. 5 and showing a step of manufacturing a semiconductor memory device according to the first embodiment of the present invention.

Then, as shown in FIG. 6, the sputtering process is used to deposit the insulating hydrogen barrier film 26 composed of, for example, $Al_2O_3$, to a thickness of about 20 nm. Then, the second interlayer insulating film 27 composed of, for example, PECVD-$SiO_2$ film is deposited on the hydrogen barrier film 26 to a thickness of about 1,200 nm. Subsequently, the top surface of the second interlayer insulating film 27 is flattened by CMP. At this time, the flattening may be carried out so that about 500 nm of the second interlayer insulating film 27 is left on the capacitors 25a and 25b.

Then, as shown in FIG. 2, the second interlayer insulating film 27, the hydrogen barrier film 26, and the hard mask layer 24 are partly etched to form contact holes 28a and 28b through which the upper electrode 23 is exposed. Then, annealing is executed at 600° C. for one hour in order to eliminate possible damage to the capacitor 25a owing to the formation of the contact holes 28a and 28b. This allows the diffusion, through the contact holes 28a and 28b, of unwanted volatile components (mainly $H_2O$, $O_2$ and the like) attributed to the interlayer insulating film 18, deposited immediately below the hydrogen barrier film 26. Then, the first and second interlayer insulating films 18 and 27, the hydrogen barrier film 26, and the gate insulating film 12 are removed by anisotropic etching to form a contact hole 29 through which the source/drain diffusion layer 15 is exposed. Then, a barrier metal film (not shown) composed of Ti/TiN is formed in the contact holes 28a, 28b, and 29. The MOCVD process is used to fill a metal material composed of tungsten, into the contact holes 28a, 28b, and 29. Then, the CMP is executed to flatten the metal material until the top surface of the second interlayer insulating film 27 is exposed. Thus, the contacts 30a, 30b, and 30d are formed. Then, a conventional technique such as a sputter/anisotropic etching process or a damascene process is used to form the interconnects 31a, 31b, 31c, 31d, 31e, and 31f. Subsequently, required numbers of interlayer insulating films, contacts, and interconnects are provided to form a ferroelectric memory.

According to the above first embodiment, not only the capacitor 25a and the capacitor contact 30a are formed in the memory cell portion, which actually requires a capacitor, but the dummy capacitor 25b and dummy capacitor contact 30b, which do not perform circuit operations, are formed in a marginal area in the peripheral circuit portion, which does not actually require any capacitors. This produces the following effects.

(1) During the annealing step after the contact holes 28a and 28b have been formed, volatile components accumulated immediately below the hydrogen barrier film 26 can be diffused to the exterior of a wafer through the contact hole 28a, penetrating the hydrogen barrier film 26 in the memory cell portion. By thus increasing the number of paths through which volatile components are diffused, it is possible to control released gases. Accordingly, even if the contact hole 29, penetrating the hydrogen barrier film 26, is formed after annealing, it is possible to suppress the explosive evaporation of volatile components through the contact hole 29. Thus, when the contact hole 29 is filled with the metal material, it is possible to hinder voids from being created by gasses resulting from volatile components. Therefore, inappropriate contacts can be avoided.

(2) In the prior art, during the step of flattening the interlayer insulating film 27 after the capacitor has been formed, a step may be formed between a region with the capacitor and a region without the capacitor. The step may result in inappropriate exposure in a lithography step and thus improper contacts. In contrast, in the first embodiment, the dummy capacitor 25b is placed in the peripheral circuit portion, which inherently does not contain any capacitors. This serves to prevent the formation of a step between the memory cell portion and the peripheral circuit portion during the step of flattening the interlayer insulating film 27. It is thus possible to solve the problems including inappropriate exposure and contacts.

The dummy capacitor 25b is not limited to the peripheral circuit portion. It can be placed in any region which conventionally does not contain any capacitors but which has a sufficient space.

Figure 7:
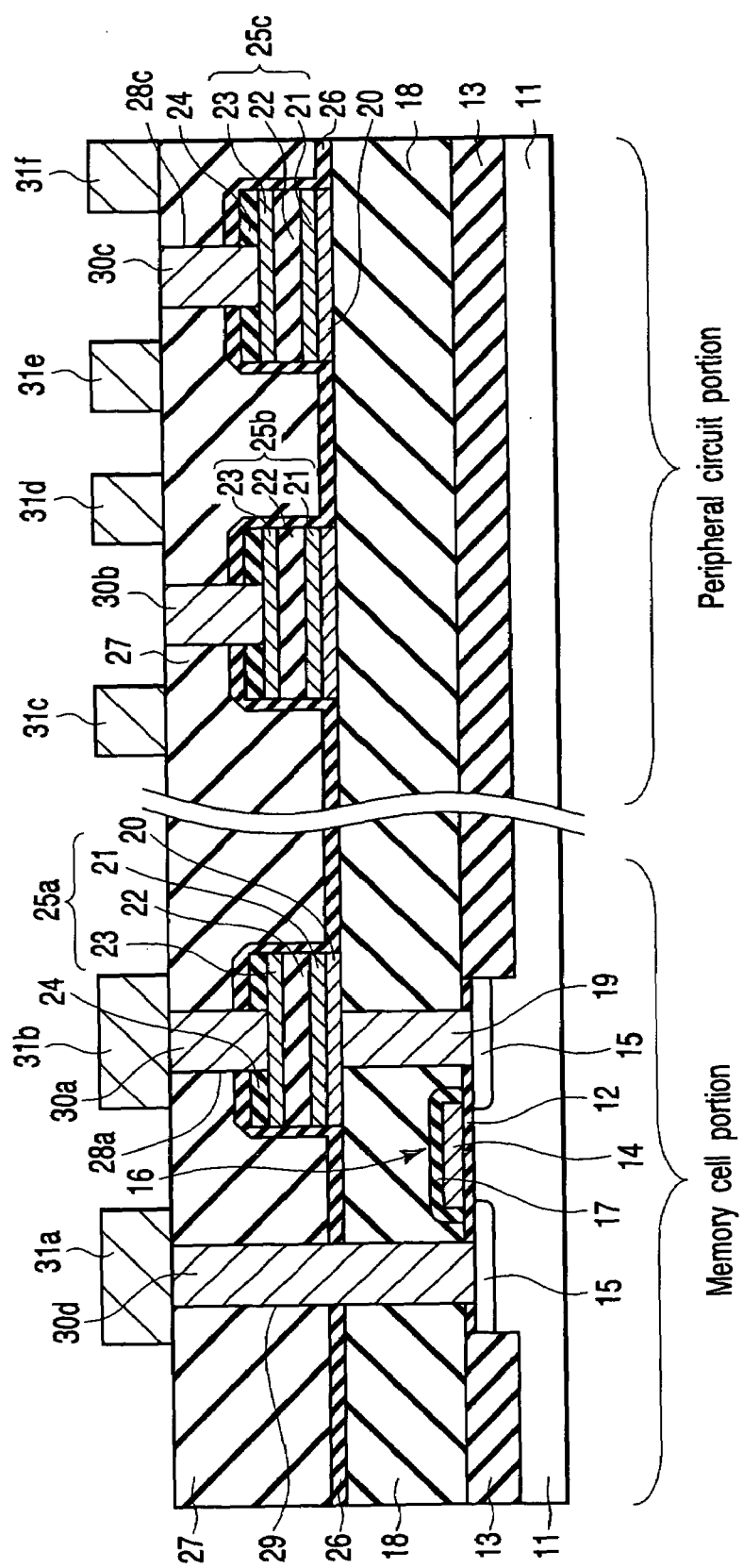
FIG. 7 is a sectional view showing a variation of the semiconductor memory device according to the first embodiment of the present invention.

Further, as shown in FIG. 7, if there is sufficient space, a plurality of the dummy capacitors 25b, 25b and a plurality of the dummy capacitor contacts 30b and 30c may be provided.

Figure 8:
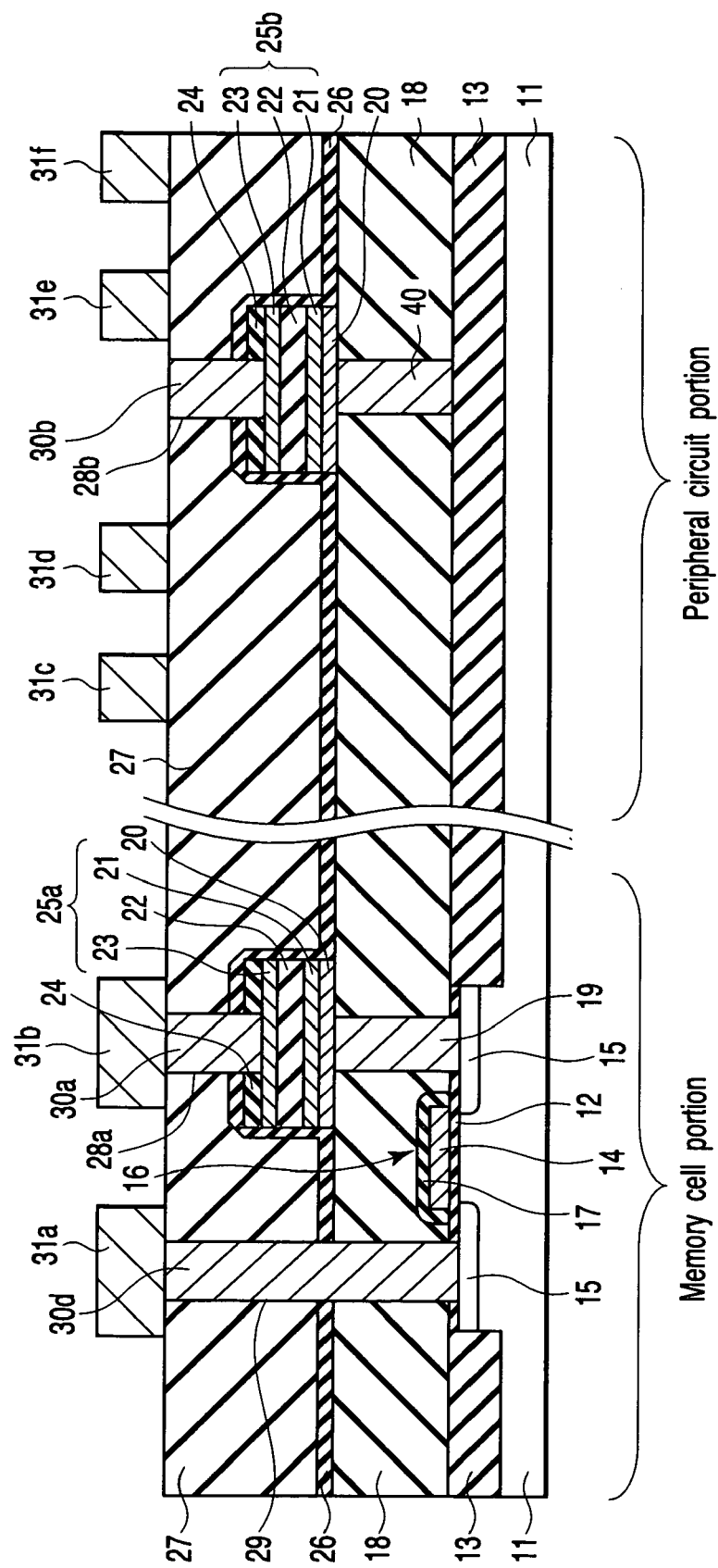
FIG. 8 is a sectional view showing a variation of the semiconductor memory device according to the first embodiment of the present invention.

Furthermore, as shown in FIG. 8, a contact 40 may be formed immediately below the dummy capacitor 25b simultaneously with the formation of the contact 19 in the memory cell portion. In this case, it is also possible to hinder the formation of a step between the memory cell portion and the peripheral circuit portion when the interlayer insulating film 18 is flattened. Since the capacitor 25b and the contacts 30b and 40 must be in the floating state, the insulating film of the element isolation region 13 is desirably formed under the contact 40.

Second Embodiment

A second embodiment is an example in which the evaporation of gases accumulated under the hydrogen barrier film is controlled by forming a dummy capacitor in a peripheral circuit portion that conventionally does not contain capacitors or the like.

Figure 9:
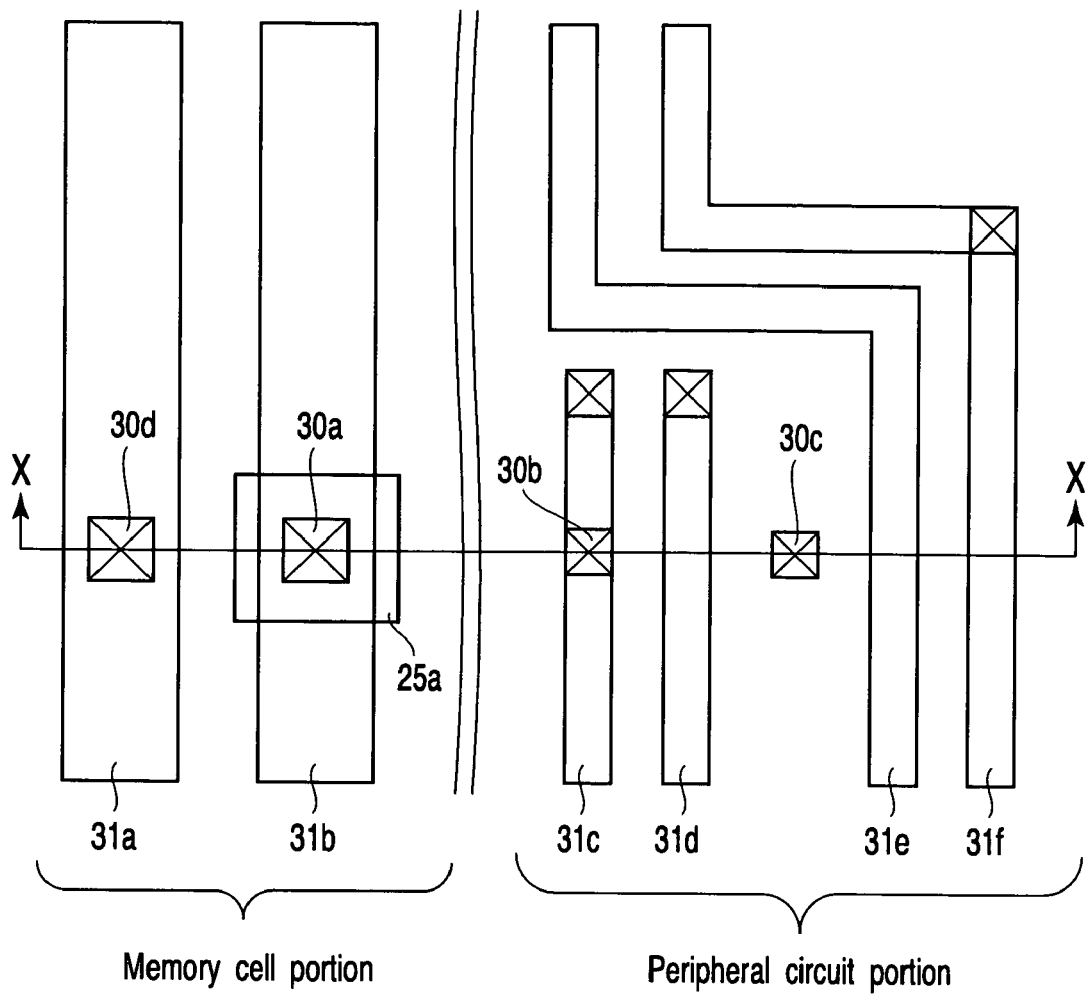
FIG. 9 is a plan view showing a semiconductor memory device according to a second embodiment of the present invention.
Figure 10:
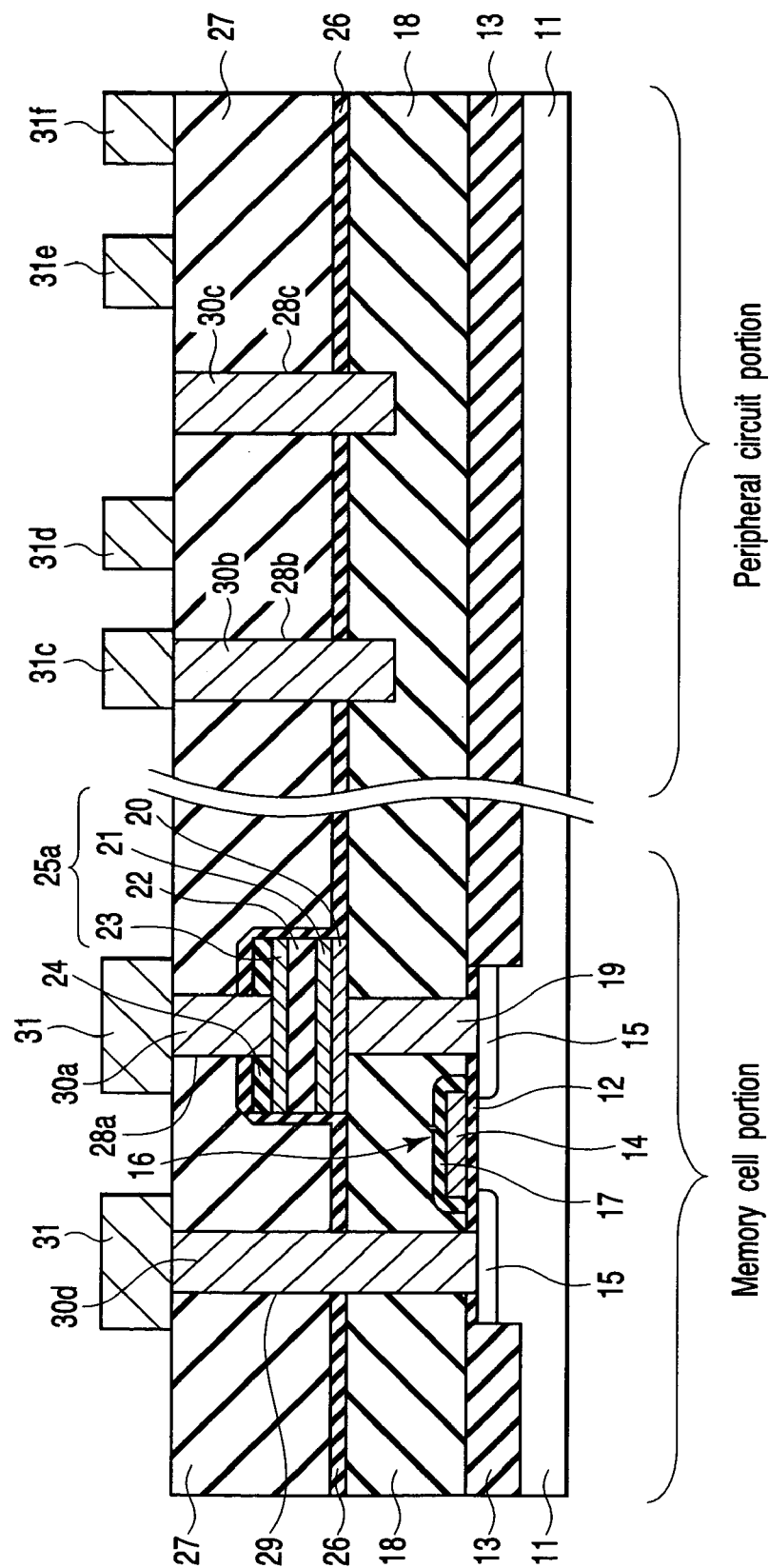
FIG. 10 is a sectional view of a semiconductor device taken along a line X-X in FIG. 9.

FIGS. 9 and 10 show a semiconductor memory device according to a second embodiment of the present invention. As shown in FIGS. 9 and 10, the second embodiment is the same as the first embodiment except that in the peripheral circuit portion, no dummy capacitors but only dummy capacitor contacts 30b and 30c are formed.

At least one end of each of the contacts 30b and 30c is not electrically connected to other interconnects or elements and is in the floating state. Consequently, no current flows through the contact 30b. Further, the contacts 30b and 30c are provided through the hydrogen barrier film 26 and do not reach the silicon substrate 11.

Figure 12:
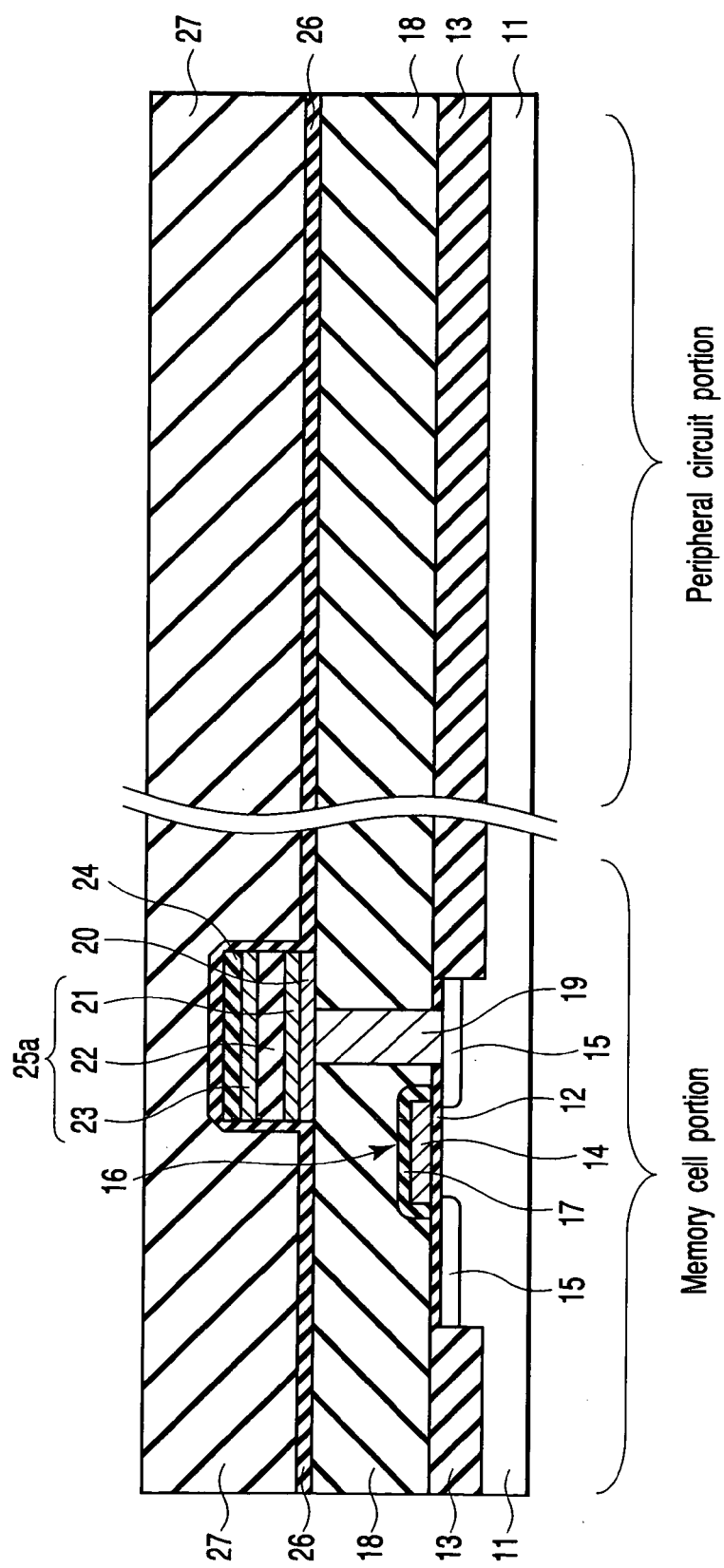
FIG. 12 is a sectional view showing a continued part of FIG. 11 and showing a step of manufacturing a semiconductor memory device according to the second embodiment of the present invention.

FIGS. 11 and 12 are sectional views of steps of manufacturing a semiconductor memory device according to a second embodiment of the present invention. Description will be given below of a method of manufacturing a semiconductor memory device according to the second embodiment.

First, as shown in FIGS. 3 and 4, the barrier film 20, the lower electrode 21, the ferroelectric film 22, the upper electrode 23, and the hard mask layer 24 are sequentially deposited as in the case of the first embodiment.

Then, as shown in FIG. 11, a resist (not shown) is formed on the hard mask layer 24 and then patterned. The patterned resist is then used as a mask to remove the hard mask layer 24 by anisotropic etching. At this time, the hard mask layer 24 is left only in a region of the memory cell portion in which the capacitor is to be formed. Then, the patterned hard mask layer 24 is used to remove the upper electrode 23, the ferroelectric film 22, the lower electrode 21, and the barrier film 20 by anisotropic etching. In this case, the upper electrode 23, the ferroelectric film 22, the lower electrode 21, and the barrier film 20 are desirably etched at a time by changing etching conditions for the respective materials of the films. In this manner, the ferroelectric capacitor 25a is formed only in the memory cell portion. No dummy capacitors are formed in the peripheral circuit portion. Then, a normal ashing process is used to remove the resist. Subsequently, annealing is executed at 600° C. for one hour in order to eliminate possible damage done to the capacitor 25a during the capacitor processing.

Then, as shown in FIG. 12, the sputtering process is used to deposit the insulating hydrogen barrier film 26 composed of, for example, $Al_2O_3$, to a thickness of about 20 nm. Then, the second interlayer insulating film 27 composed of, for example, $PECVD$-$SiO_2$ film is deposited on the hydrogen barrier film 26 to a thickness of about 1,200 nm. Subsequently, the top surface of the second interlayer insulating film 27 is flattened by CMP. At this time, the flattening may be carried out so that about 500 nm of the second interlayer insulating film 27 is left on the capacitor 25a.

Then, as shown in FIG. 10, the second interlayer insulating film 27, the hydrogen barrier film 26, and the hard mask layer 24 are partly etched to form the contact hole 28a through which the upper electrode 23 is exposed, and dummy contact holes 28b and 28c. In this case, for the dummy contact holes 28b and 28c, etching is controlled so that their bottom portions lie inside the interlayer insulating film 18. Then, annealing is executed at 600° C. for one hour in order to eliminate possible damage to the capacitor 25a owing to the formation of the contact holes 28a, 28b, and 28c. This allows the diffusion, through the contact holes 28a, 28b, and 28c, of unwanted volatile components (mainly $H_2O$, $O_2$, and the like) attributed to the interlayer insulating film 18, deposited immediately below the hydrogen barrier film 26. Then, the first and second interlayer insulating films 18 and 27, the hydrogen barrier film 26, and the gate insulating film 12 are removed by anisotropic etching to form the contact hole 29 through which the source/drain diffusion layer 15 is exposed. Then, a barrier metal film (not shown) composed of Ti/TiN is formed in the contact holes 28a, 28b, 28c, and 29. The MOCVD process is used to fill a metal material composed of tungsten, into the contact holes 28a, 28b, 28c, and 29. Then, the CMP is executed to flatten the metal material until the top surface of the second interlayer insulating film 27 is exposed. Thus, the contacts 30a, 30b, 30c, and 30d are formed. Then, the conventional technique such as the sputter/anisotropic etching process or the damascene process is used to form the interconnects 31a, 31b, 31c, 31d, 31e, and 31f. Subsequently, required numbers of interlayer insulating films, contacts, and interconnects are provided to form a ferroelectric memory.

According to the above second embodiment, not only the capacitor contact 30a is formed in the memory cell portion, which actually requires a capacitor, but the dummy capacitor contacts 30b and 30c, which do not perform circuit operations, are formed in a marginal area in the peripheral circuit portion, which does not actually requires any capacitors. Thus, during the annealing step after the contact holes 28a, 28b, and 28c have been formed, volatile components accumulated in the interlayer insulating film 18 can be diffused to the exterior of a wafer through the contact hole 28a, penetrating the hydrogen barrier film 26 in the memory cell portion. By thus increasing the number of paths through which volatile components are diffused, it is possible to control released gases. Accordingly, even if the contact hole 29, penetrating the hydrogen barrier film 26, is formed after annealing, it is possible to suppress the explosive evaporation of volatile components through the contact hole 29. Thus, when the contact hole 29 is filled with the metal material, it is possible to hinder voids from being created by gasses resulting from volatile components. Therefore, inappropriate contacts can be avoided.

The depths of the dummy contacts 30b and 30c can be varied as described below provided that the dummy contacts penetrate the hydrogen barrier film 26.

Figure 13:
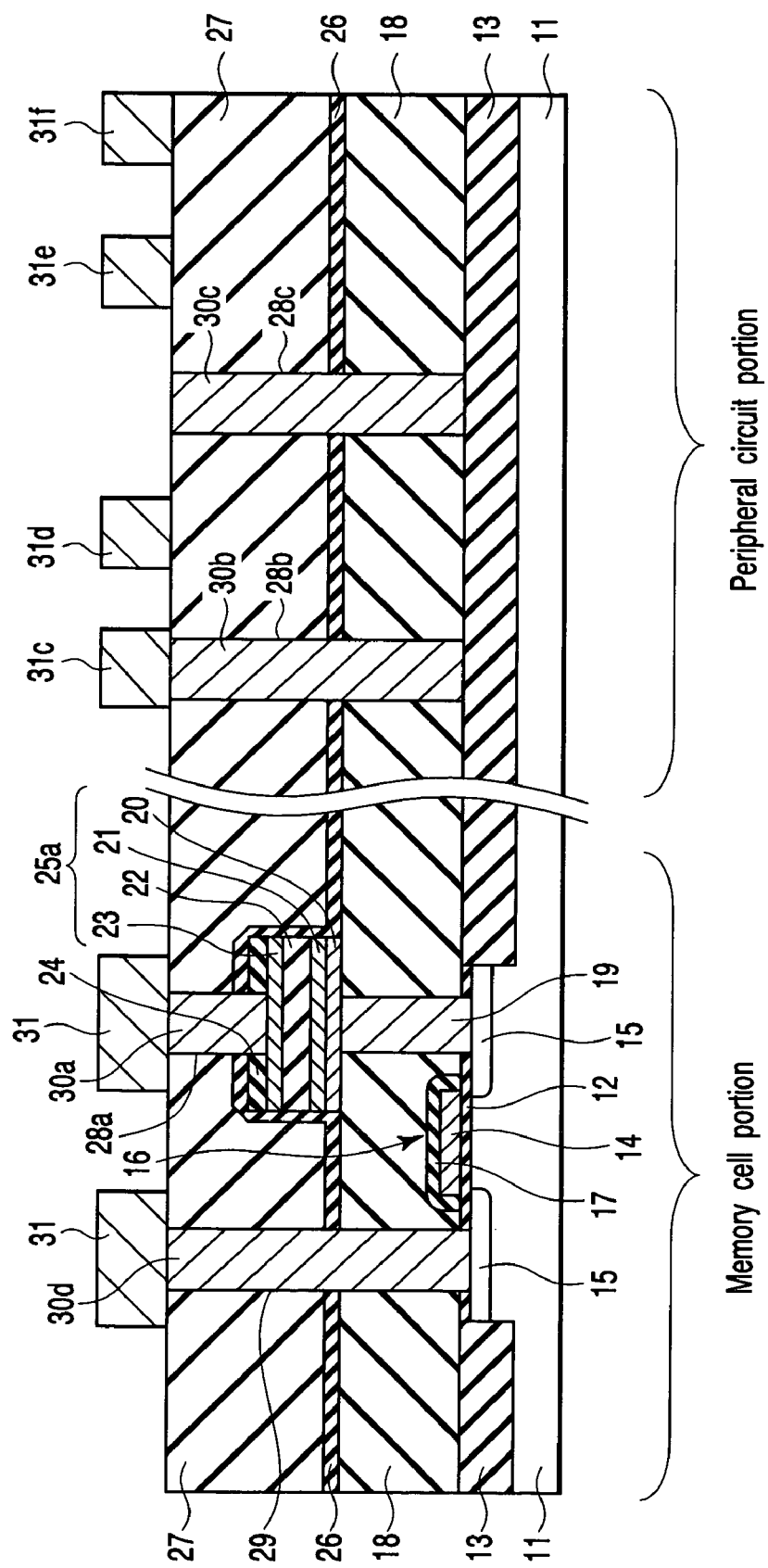
FIG. 13 is a sectional view showing a variation of the semiconductor memory device according to the second embodiment of the present invention.

For example, as shown in FIG. 13, the dummy contacts 30b and 30c may reach the silicon substrate 11 via parts of the element isolation region 13 which are formed in the silicon substrate 11. In this case, the element isolation region 13 can be used as a stopper for the formation of the contact holes 28b and 28c.

Figure 14:
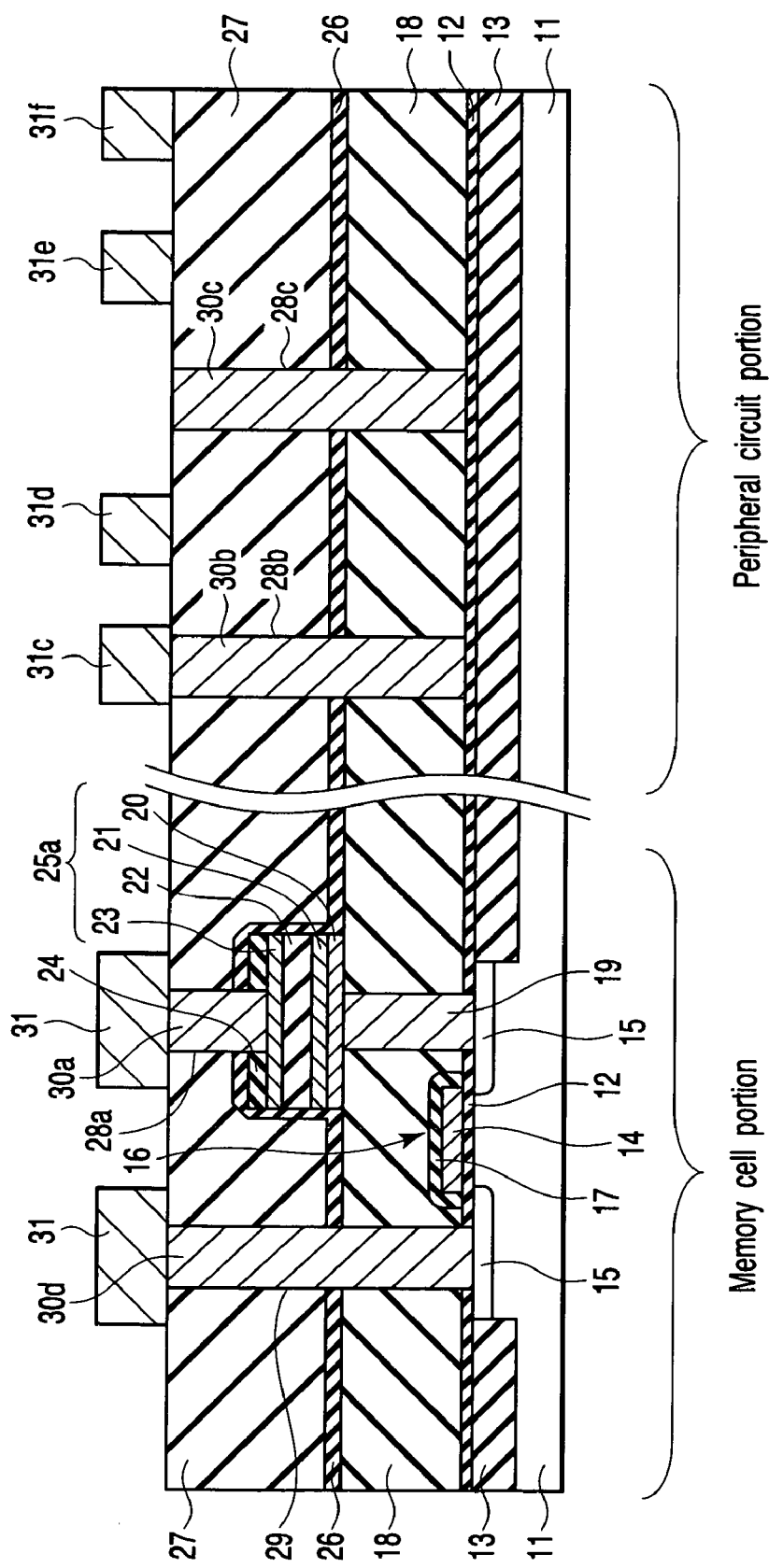
FIG. 14 is a sectional view showing a variation of the semiconductor memory device according to the second embodiment of the present invention.

Further, as shown in FIG. 14, the contacts 30b and 30c may be formed so as to reach the gate insulating film 12. In this case, the gate insulating film 12 in the memory cell portion may also be formed on the silicon substrate in the peripheral circuit portion. Then, the gate insulating film 12 may be used as a stopper for the formation of the contact holes 28b and 28c.

Figure 15:
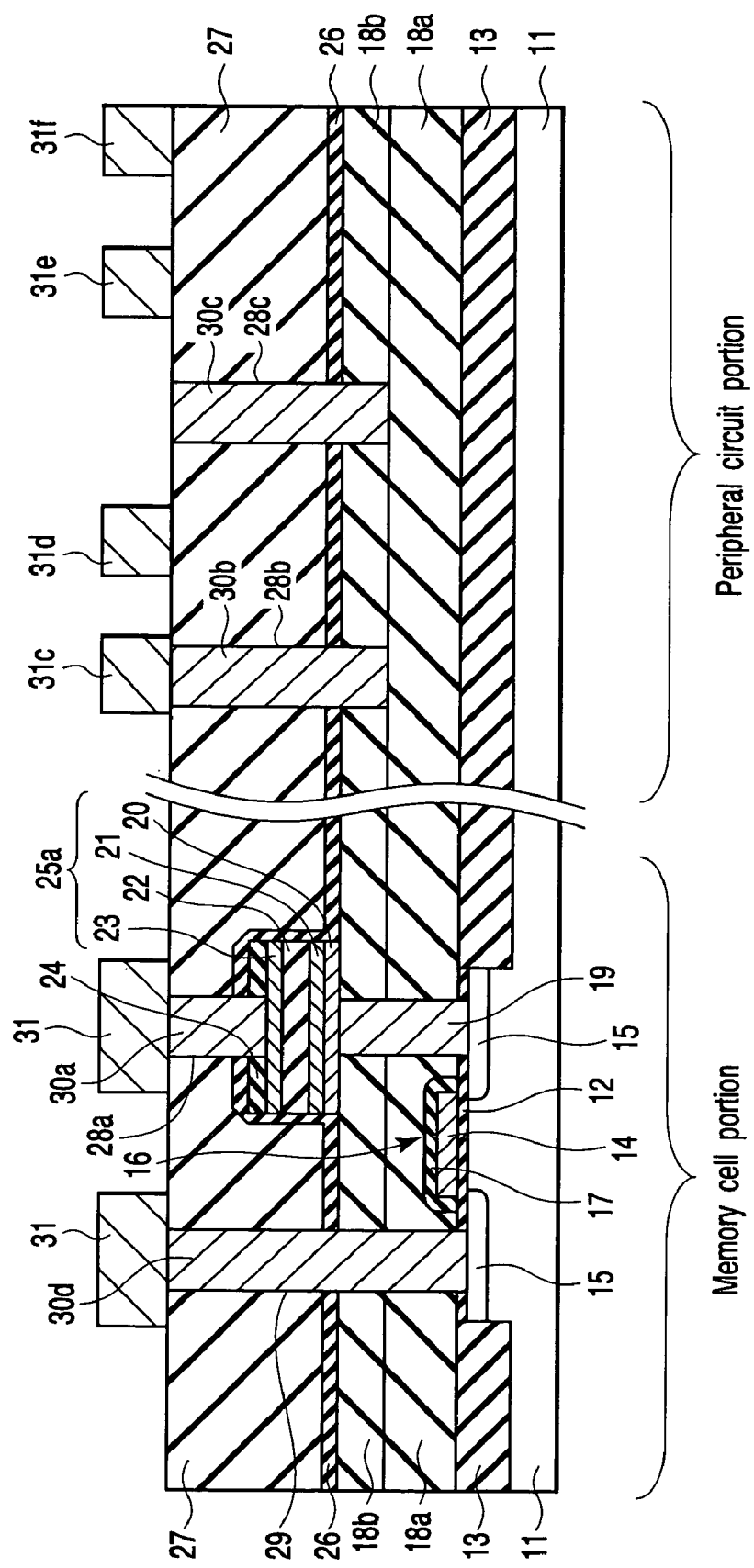
FIG. 15 is a sectional view showing a variation of the semiconductor memory device according to the second embodiment of the present invention.

Further, as shown in FIG. 15, the contacts 30b and 30c may be formed so as to reach the top surface of a film 18a constituting a part of a multilayer film under the capacitor 25a. In this case, a multilayer composed of, for example, an SiN film 18a and an SiO$_2$ film 18b may be formed under the capacitor 25a. Then, the SiN film 18a may be used as a stopper for the formation of the contact holes 28n and 28c.

Furthermore, the hydrogen barrier film 26 may be formed above the capacitor 25a and 25b. For example, the hydrogen barrier film 26 may be directly formed on the capacitor 25a and 25b, and a layer may be formed between the hydrogen barrier film 26 and the capacitor 25a and 25b.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a semiconductor substrate having a first region and a second region;
   a transistor placed in the first region of the semiconductor substrate;
   a first insulating film formed on the semiconductor substrate in the first and second regions and on the transistor;
   a first ferroelectric capacitor formed on the first insulating film in the first region and electrically connected to the transistor;
   a hydrogen barrier film formed above the first ferroelectric capacitor and formed above the first insulating film in the first and second regions;
   a contact penetrating the hydrogen barrier film in the first region and electrically connected to the first ferroelectric capacitor; and
   a dummy contact which penetrates completely through the hydrogen barrier film in the second region and which is in a floating state.

2. The semiconductor device according to claim 1, wherein the dummy contact does not reach the semiconductor substrate.

3. The semiconductor device according to claim 1, further comprising a second ferroelectric capacitor which is formed on the first insulating film in the second region and to which the dummy contact is connected, the second ferroelectric capacitor being in the floating state.

4. The semiconductor device according to claim 3, wherein the second ferroelectric capacitor is formed to have a same shape as that of the first ferroelectric capacitor.

5. The semiconductor device according to claim 3, further comprising first and second oxygen barrier films formed under the first and second ferroelectric capacitors, respectively.

6. The semiconductor device according to claim 1, wherein the first region is a memory cell portion, and the second region is a peripheral circuit portion.

7. The semiconductor device according to claim 1, wherein contacts formed in the second region are in the floating state, the contacts include the dummy contact and no ferroelectric capacitor is formed in the second region.

* * * * *